US012701664B2

(12) United States Patent
Kim et al.

(10) Patent No.: US 12,701,664 B2
(45) Date of Patent: Aug. 4, 2026

(54) SOLDER REFLOW APPARATUS AND METHOD OF MANUFACTURING AN ELECTRONIC DEVICE

(71) Applicant: SAMSUNG ELECTRONICS CO., LTD., Suwon-si (KR)

(72) Inventors: Youngja Kim, Suwon-si (KR); Donguk Kwon, Suwon-si (KR); Youngmin Lee, Suwon-si (KR); Byungkeun Kang, Suwon-si (KR); Gongmyeong Kim, Suwon-si (KR); Chaein Moon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 547 days.

(21) Appl. No.: 18/127,531

(22) Filed: Mar. 28, 2023

(65) Prior Publication Data

US 2024/0049400 A1 Feb. 8, 2024

(51) Int. Cl.
H05K 3/3494 (2026.01)
H05K 3/3447 (2026.01)
(Continued)

(52) U.S. Cl.
CPC ......... H05K 3/3494 (2013.01); H05K 3/3447 (2013.01); H10W 72/20 (2026.01); H10W 72/07236 (2026.01)

(58) Field of Classification Search
CPC . H01L 2224/03849; H01L 2224/11849; H01L 23/13; H01L 23/345; H01L 2224/81815; H01L 2224/75101; H01L 23/44–445;

H01L 23/46–467; H01L 23/498–49822; H01L 2224/161; H01L 2224/16111; H01L 2224/16112; H01L 2224/171; H01L 2224/17106; H01L 2224/16221; H01L 2224/16227; H01L 2224/16135; H01L 2224/16145; H01L 2224/16147; H01L 2224/04–0401; H01L 2223/54453; H01L 2223/5446; H01L 2224/113–1133; H01L 2224/1302;
(Continued)

(56) References Cited

U.S. PATENT DOCUMENTS

| | | | | |
|---|---|---|---|---|
| 4,022,371 A | * | 5/1977 | Skarvinko ............ | B23K 35/386 228/234.2 |
| 6,014,318 A | | 1/2000 | Takeda | |

(Continued)

FOREIGN PATENT DOCUMENTS

KR 10-1352603 B1 1/2014

*Primary Examiner* — Julio J Maldonado
*Assistant Examiner* — Eric Manuel Mulero Flores
(74) *Attorney, Agent, or Firm* — Sughrue Mion, PLLC

(57) ABSTRACT

A method of manufacturing an electronic device, includes: providing a substrate including a plurality of mounting regions on which electronic components are mounted respectively; forming a plurality of vapor passage holes that penetrate the substrate; disposing the electronic components on the substrate via bumps; heating a first heat transfer fluid to generate a second heat transfer fluid in a vapor state; supplying at least a portion of the second heat transfer fluid in the vapor state through the vapor passage holes of the substrate; and soldering the bumps using the at least the portion of the second heat transfer fluid in the vapor state.

14 Claims, 8 Drawing Sheets

(51) Int. Cl.
  *H10W 72/00* (2026.01)
  *H10W 72/20* (2026.01)

(58) Field of Classification Search
  CPC ........ H01L 2224/13022; H05K 3/3494; H05K 3/341–3415; B23K 1/012; B23K 1/015; B23K 1/0016; B23K 2101/40–42; H10W 72/0198; H10W 72/0711; H10W 72/072; H10W 72/07234; H10W 72/07241; H10W 72/07236; H10W 72/07336; H10W 70/654; H10W 70/01–699; H10P 72/0434; H10P 54/20–52
  See application file for complete search history.

(56) References Cited

U.S. PATENT DOCUMENTS

| | | | |
|---|---|---|---|
| 6,054,755 A | 4/2000 | Takamichi et al. | |
| 6,452,266 B1 | 9/2002 | Iwaya et al. | |
| 7,748,600 B2 | 7/2010 | Leicht | |
| 9,768,090 B2 * | 9/2017 | Liang | H01L 23/5384 |
| 9,818,703 B2 | 11/2017 | Jang et al. | |
| 2011/0248074 A1 * | 10/2011 | Davies | B23K 1/008 |
| | | | 228/19 |
| 2015/0221554 A1 * | 8/2015 | Kosaka | H10P 54/00 |
| | | | 438/462 |
| 2019/0221446 A1 * | 7/2019 | Huang | H01L 21/481 |
| 2021/0219428 A1 | 7/2021 | Ingelhag et al. | |
| 2022/0216170 A1 * | 7/2022 | Teoh | H01L 24/742 |
| 2024/0038649 A1 * | 2/2024 | Kuo | H01L 23/145 |

* cited by examiner

START

FORM VAPOR PENETRATION HOLES IN
SUBSTRATE — S100

COAT SOLDER PASTE ON SUBSTRATE — S100

DISPOSE SOLDER ON SOLDER PASTE — S110

PERFORM VAPOR PHASE SOLDERING PROCESS — S120

FORM MOLDING MEMBER ON SUBSTRATE — S130

END

SOLDER REFLOW APPARATUS AND METHOD OF MANUFACTURING AN ELECTRONIC DEVICE

PRIORITY STATEMENT

This application claims priority under 35 U.S.C. § 119 to Korean Patent Application No. 10-2022-0096838, filed on Aug. 3, 2022 in the Korean Intellectual Property Office (KIPO), the contents of which are herein incorporated by reference in their entirety.

BACKGROUND

1. Field

The disclosure relates to a solder reflow apparatus and a method of manufacturing an electronic device using the same. More particularly, example embodiments relate to a solder reflow apparatus using a vapor phase solder method and a method of manufacturing a semiconductor package using the same.

2. Description of the Related Art

A convection reflow method, a laser assisted bonding method, a vapor phase soldering method, or the like may be used to solder a solder paste in the field of Surface Mount Technology (SMT). In a case of the vapor phase soldering method among them, it may be possible to provide a uniform temperature distribution over the entire substrate such as a Printed Circuit Board (PCB) during saturation of vapor inside an oven, and because the boiling point of a heat transfer fluid is predetermined, overheating may be prevented by setting the target temperature high.

However, when performing a solder reflow process according to the vapor phase soldering method, since an amount of a vapor supplied to a central region of a substrate and an amount of a vapor supplied to a peripheral region of the substrate are different, there is a problem in that effective heat transfer over the entire surface is difficult.

SUMMARY

The present disclosure relates to a method of manufacturing an electronic device that can efficiently perform a solder reflow process through uniform heat transfer across the entire surface of a substrate.

According to an aspect of the disclosure, a method of manufacturing an electronic device, includes: providing a substrate including a plurality of mounting regions on which electronic components are mounted respectively; forming a plurality of vapor passage holes that penetrate the substrate; disposing the electronic components on the substrate via bumps; heating a first heat transfer fluid to generate a second heat transfer fluid in a vapor state; supplying at least a portion of the second heat transfer fluid in the vapor state through the vapor passage holes of the substrate; and soldering the bumps using the at least the portion of the second heat transfer fluid in the vapor state.

The plurality of vapor passage holes is formed in a cutting region that is disposed around the plurality of mounting regions.

The forming the plurality of vapor passage holes includes: forming a first set of the plurality of vapor passage holes in a first region of the substrate; and forming a second set of the plurality of vapor passage holes in a second region of the substrate.

The first set of the plurality of vapor passage holes has a diameter of a first size, and the second set of the plurality of vapor passage holes has a diameter of a second size smaller than the first size.

The first region is disposed in the cutting region that is disposed around the plurality of mounting regions and the second region is disposed in the plurality of mounting regions.

The first region is disposed in a central region of the substrate, and the second region is disposed in a peripheral region of the substrate.

The soldering the bumps using the at least the portion of the second heat transfer fluid in the vapor state includes: loading the substrate on which the electronic components are disposed into a vapor generating chamber that accommodates the first heat transfer fluid.

The disposing the electronic components on the substrate via the bumps includes: printing a solder paste on substrate pads of the substrate; forming solders on input/output pads of the electronic component; and disposing the electronic component on the substrate such that the solders are interposed between the input/output pad and the solder paste.

After soldering the bumps, the method further includes forming a molding member on the substrate to cover the electronic components.

According to another aspect of the disclosure, a method of manufacturing an electronic device, includes: forming a plurality of vapor passage holes that penetrate a substrate, the substrate includes a plurality of mounting regions on which electronic components are mounted respectively; disposing the electronic components on the substrate via bumps; loading the substrate on which the electronic components are disposed into a vapor generating chamber that accommodates a first heat transfer fluid; heating the first heat transfer fluid to generate a second heat transfer fluid in a vapor state within the vapor generating chamber; supplying the second heat transfer fluid in the vapor state through the vapor passage holes; and soldering the bumps using the second heat transfer fluid in the vapor state.

The plurality of vapor passage holes is formed in a cutting region that is disposed around the plurality of mounting regions.

The forming the plurality of vapor passage holes includes: forming a first set of the plurality of vapor passage holes in a first region of the substrate; and forming a second set of the plurality of vapor passage holes in a second region of the substrate.

The first set of the plurality of vapor passage holes has a diameter of a first size, and the second set of the plurality of vapor passage hole has a diameter of a second size smaller than the first size.

The first region is located in the cutting region that is disposed around the plurality of mounting regions and the second region is located in the plurality of mounting regions.

The first region is disposed in a central region of the substrate, and the second region is disposed in a peripheral region of the substrate.

The disposing the electronic components on the substrate via the bumps includes: printing a solder paste on substrate pads of the substrate; forming solders on input/output pads of the electronic component; and disposing the electronic component on the substrate such that the solders are interposed between the input/output pad and the solder paste.

After soldering the bumps, the method further includes unloading the substrate from the vapor generating chamber; and forming a molding member on the substrate to cover the electronic components.

The method further includes cutting the substrate along a cutting region that is disposed around the plurality of mounting regions.

The first heat transfer fluid includes a Galden solution.

According to another aspect of the disclosure, a method of manufacturing an electronic device, the method includes: forming a plurality of vapor passage holes that penetrate a substrate, the substrate includes a plurality of mounting regions on which electronic components are mounted respectively; printing a solder paste on substrate pads of the substrate; forming solders on input/output pads of the electronic component; and disposing the electronic components on the substrate such that the solders are interposed between the input/output pad and the solder paste; loading the substrate on which the electronic components are disposed into a vapor generating chamber that accommodates a first heat transfer fluid; heating the first heat transfer fluid to generate a second heat transfer fluid in a vapor state within the vapor generating chamber; supplying the second heat transfer fluid in the vapor state through the plurality of vapor passage holes; soldering the solders using the second heat transfer fluid in the vapor state.

The plurality of vapor passage holes is formed in a cutting region that is disposed around the plurality of mounting regions.

The forming the plurality of vapor passage holes includes: forming a first set of the plurality of vapor passage holes in a first region of the substrate; and forming a second set of the plurality of vapor passage holes in a second region of the substrate.

The first set of the plurality of vapor passage holes has a diameter of a first size, and the second set of the plurality of vapor passage holes has a diameter of a second size smaller than the first size.

The first region is disposed in the cutting region that is disposed around the plurality of mounting regions and the second region is disposed in the plurality of mounting regions.

The first region is disposed in a central region of the substrate, and the second region is disposed in a peripheral region of the substrate.

After soldering the solders, the method further incudes unloading the substrate from the vapor generating chamber; and forming a molding member on the substrate to cover the electronic components.

The method further includes cutting the substrate along a cutting region that is disposed around the plurality of mounting regions.

At this time, the vapor under a substrate stage may move through vapor passage holes of the substrate to be supplied to the solder and the surroundings of the solder. Accordingly, the vapor may be sufficiently supplied to regions adjacent to the vapor passage holes of the substrate to achieve uniform heat transfer over the entire surface of the substrate. Thus, defects in a reflow process for solders arranged at a fine pitch may be reduced and joint quality may be improved.

BRIEF DESCRIPTION OF THE DRAWINGS

Example embodiments will be more clearly understood from the following detailed description taken in conjunction with the accompanying drawings.

FIG. 1 is a cross-sectional view illustrating a solder reflow apparatus in accordance with example embodiments;

FIG. 2 is a side view illustrating the solder reflow apparatus of FIG. 1;

FIG. 3 is a perspective view illustrating a substrate stage of the solder reflow apparatus of FIG. 1;

FIG. 4 is a perspective view illustrating an article supported on the substrate stage of FIG. 3;

FIG. 5 is a flowchart illustrating a method of manufacturing an electronic device in accordance with example embodiments;

FIGS. 6 to 13 are views illustrating a method of manufacturing an electronic device in accordance with example embodiments; and FIG. 14 is a plan view illustrating a strip substrate on which semiconductor chips are mounted in accordance with example embodiments.

DETAILED DESCRIPTION

Hereinafter, example embodiments will be explained in detail with reference to the accompanying drawings.

Figure 1:
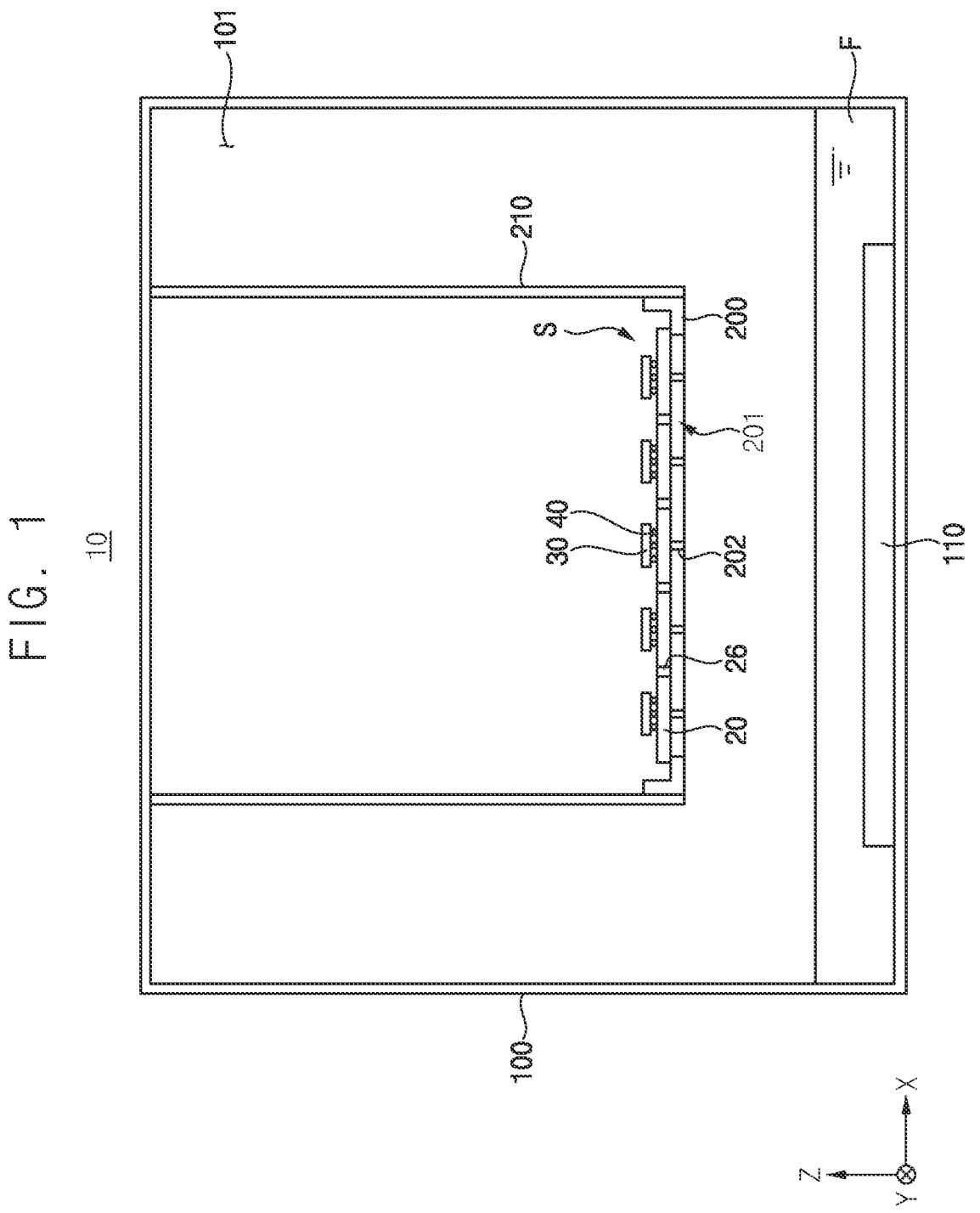
FIGS. 1 to 14 represent non-limiting, example embodiments as described herein.
Figure 2:
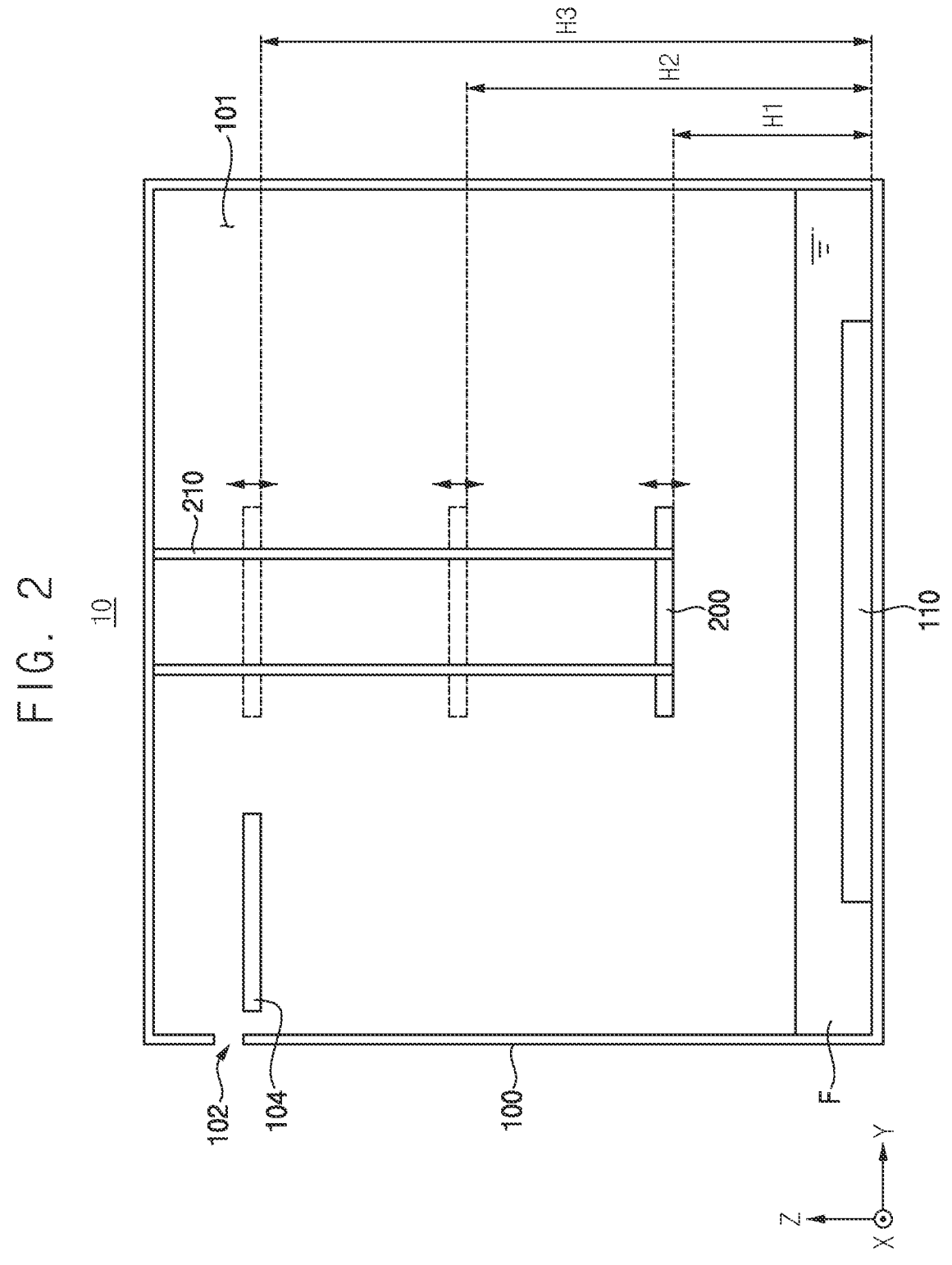
Figure 3:
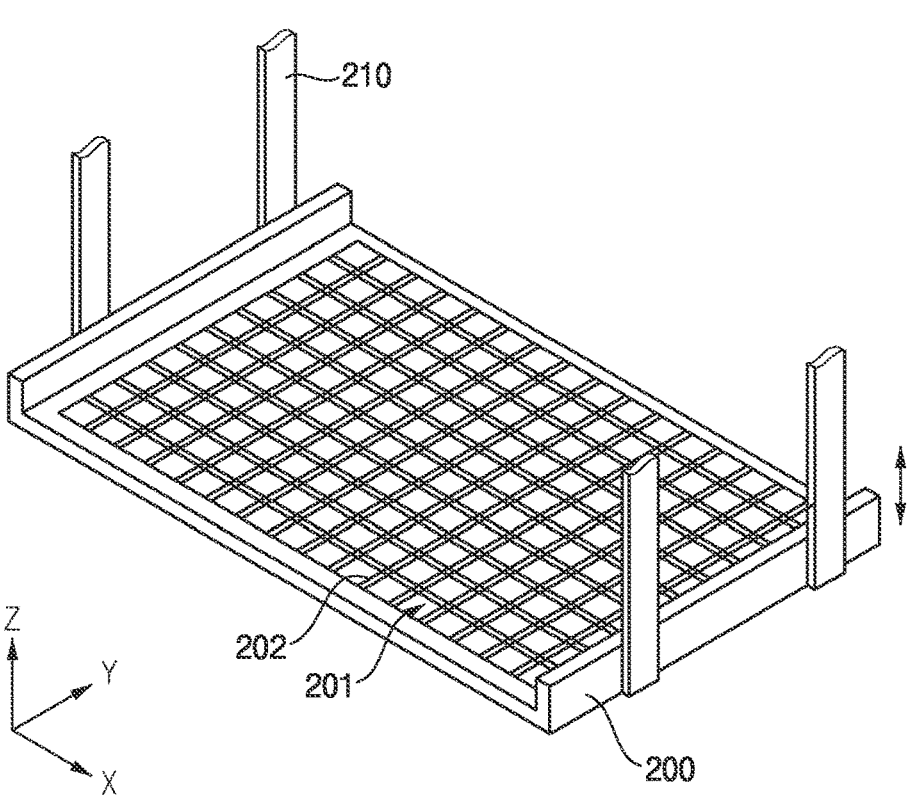
Figure 4:
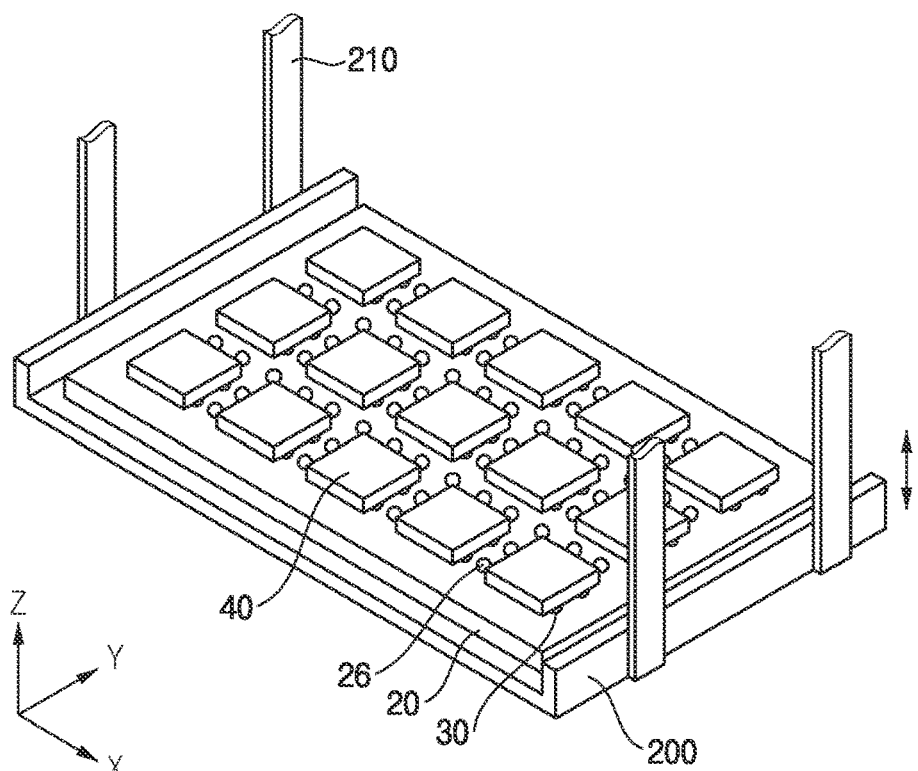

FIG. 1 is a cross-sectional view illustrating a solder reflow apparatus in accordance with example embodiments. FIG. 2 is a side view illustrating the solder reflow apparatus of FIG. 1. FIG. 3 is a perspective view illustrating a substrate stage of the solder reflow apparatus of FIG. 1. FIG. 4 is a perspective view illustrating an article supported on the substrate stage of FIG. 3.

Referring to FIGS. 1 to 4, a solder reflow apparatus 10 may include a vapor generating chamber 100, a heater 110 and a substrate stage 200. In addition, the solder reflow apparatus 10 may further include a lifting driver configured to raise and lower the substrate stage 200 and a temperature sensing portion configured to monitor temperature in the vapor generating chamber 100.

In one embodiment, the solder reflow apparatus 10 may be a vapor phase soldering apparatus configured to solder a solder paste by saturated vapor heated in the vapor generating chamber 100.

The vapor generating chamber 100 may include a lower reservoir having an oven shape to accommodate a heat transfer fluid F and to provide a space (or a gap) 101 filled with vapor that is generated directly above the fluid when the fluid F is boiling. The vapor generating chamber 100 may extend in a vertical direction (Z direction) by a predetermined height. In the vapor generating chamber 100, the heat transfer fluid may boil and the vapor may rise to the top, condense back to the liquid state at the top, and may flow back to the reservoir at the bottom.

The pressure inside the vapor generating chamber 100 may be maintained at atmospheric pressure. Alternatively, the vapor generating chamber 100 may be connected to an exhaust device such as a vacuum pump to adjust the pressure inside the vapor generating chamber 100. The pressure inside the vapor generating chamber may be maintained at a predetermined pressure in order to change the boiling point of the heat transfer fluid or soldering environments.

The heat transfer fluid F may be a chemical material selected to provide the vapor necessary for vapor phase soldering. The heat transfer fluid F may be selected in consideration of boiling point, environmental influences, and corrosiveness of the generated vapor. The heat transfer fluid F may include an inert organic liquid. For example, the heat transfer fluid F may include a perfluoropolyether (PFPEs)-based Galden solution. The boiling point of the Galden solution may be 230° C.

The heater 110 may heat the heat transfer fluid F accommodated in the vapor generating chamber 100 to generate saturated vapors. The heater 110 may include an electrical resistor immersed in the heat transfer fluid F on the bottom of the vapor generating chamber 100. Alternatively, the heater 110 may include a resistor in the form of a coil surrounding the reservoir tank.

In addition, another heater as a portion of a temperature control mechanism may be installed on a sidewall of the vapor generating chamber 100 to control the temperature of the vapor generating chamber 100 during a reflow process.

As illustrated in FIGS. 3 and 4, the substrate stage 200 may support an article S (shown in FIG. 1) on which a solder process is performed in the vapor generating chamber 100. The substrate stage 200 may include a mesh type support structure for supporting the article S. The mesh type support structure may include support wires 202 that define a plurality of openings 201 through which the vapor moves. For example, the article S may include a substrate 20 on which an electronic component 30 is mounted via a solder 40. The sizes and shapes of the openings, thicknesses of the support wires, etc. may be determined in consideration of the temperature profile in the vapor generating chamber.

The substrate 20 supported on the substrate stage 200 may have a plurality of vapor passage holes (e.g., the first vapor passage hole 26). The vapor passage holes (e.g., the first vapor passage hole 26) may be in communication with the openings 201 of the substrate stage 200. Accordingly, the vapor under the substrate stage 200 may move through the openings 201 of the substrate stage 200 and the vapor passage holes (e.g., the first vapor passage hole 26) of the substrate 20 to be supplied to the solder 40 and the surroundings of the solder 40.

The substrate stage 200 may be installed (or configured) to be movable upward and downward within the vapor generating chamber 100, as indicated in FIG. 4 (the vertical arrow). The lifting driver for moving the substrate stage 200 upward and downward may include various types of actuators such as a transfer rail, a transfer screw, a transfer belt, etc. Both end portions of the substrate stage 200 may be supported by transfer rods 210 respectively, and the substrate stage 200 may be moved up and down by the lifting driver.

As illustrated in FIG. 2, the article S for soldering may be transferred into the vapor generating chamber 100 through a gate 102 of the vapor generating chamber 100, and the article S may be loaded on the substrate stage 200 by a transfer mechanism 104 such as a guide rail or a transport pusher.

After the article S is loaded, the Galden solution F may be heated by the heater 110 and start to boil. The saturated vapor from the Galden solution may be distributed within the space 101 of the vapor generating chamber 100. At this time, the density of the saturated vapor may vary depending on the height, and thus a temperature gradient may be formed.

For example, the temperature T1 of the vapor generating chamber at a third height H3 may be 100° C. The temperature T2 of the vapor generating chamber at a second height H2 may be 170° C. The temperature T3 of the vapor generating chamber at a first height H1 may be 230° C. The solder 40 may include Sn—Ag—Cu (SAC) solder, Sn—Ag solder, etc. Since the boiling point of the SAC solder is 217° C., the temperature T3 at the first height H1, which is a reflow section, may be maintained at 230° C.

Hereinafter, a method of performing a vapor phase reflow process using the solder reflow apparatus of FIG. 1 will be described.

First, an article S for soldering may be loaded into the vapor generating chamber 100, and the heat transfer fluid F in the vapor generating chamber 100 may be heated.

In example embodiments, a substrate 20 on which an electronic component 30 is mounted via a solder 40 may be transferred into the vapor generating chamber 100 through the gate 102 of the vapor generating chamber 100. Next, the article S may be loaded on the substrate stage 200 by the transfer mechanism 104 such as a guide rail or a transfer pusher.

After the article S is loaded, the Galden solution F may be heated by the heater 110 and start to boil. The saturated vapor from the Galden solution may be distributed within the space 101 of the vapor generating chamber 100. At this time, the vapor may have a density gradient according to the height, and thus, a temperature gradient along the vertical direction within the vapor generating chamber 100 may be formed.

For example, after the article S is preheated at the third height H3, the article may be moved to the second height H2 and activated (soaked). The substrate 20 may be preheated to prevent various soldering defects and to provide a more solid and conductive joint. There may be a secondary vapor phase produced at a cooler temperature than the main vapor layer at the third and second heights H3 and H2. No soldering takes place in this zone, only a temperature rises.

For example, the article S may be moved to the first height H1 so that the solder 40 may be reflowed. When the article S is immersed in the vapor at the first height H1, the vapor may serves as a heat transfer medium. Since the temperature of the vapor and the temperature of the substrate 20 at the first height H1 are different from each other, vapor may be condensed on a surface of the article S to form a layer. The vapor condensing on the surface may transfer latent heat to the surface of the substrate 20 during condensation to reflow a solder paste.

At this time, the vapor under the substrate stage 200 may move through the openings 201 of the substrate stage 200 and the vapor passage holes (e.g., the first vapor passage hole 26) of the substrate 20 to be supplied to the solder 40 and the surroundings of the solder 40. Accordingly, the vapor may be sufficiently supplied to regions adjacent to the vapor passage holes (e.g., the first vapor passage hole 26) of the substrate 20 to achieve uniform heat transfer over the entire area of the article S.

Then, after the solder 40 is soldered, the article S may move to the top of the chamber and then may be cooled. Accordingly, the solder joints may be cooled down and solidified.

Hereinafter, a method of manufacturing an electronic device using the solder reflow apparatus of FIG. 1 will be described. A case in which the electronic device is a semiconductor package will be described. However, the manufacturing method of the electronic device in accordance with example embodiments is not limited thereto.

Figure 5:
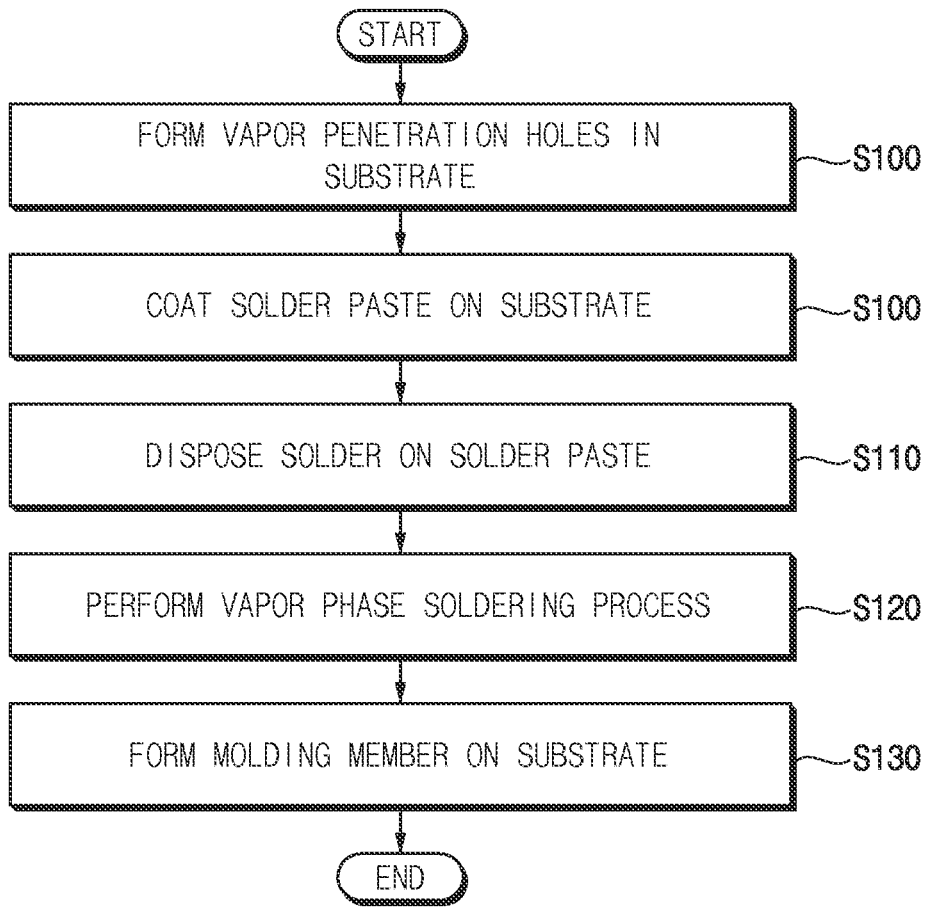
Figure 6:
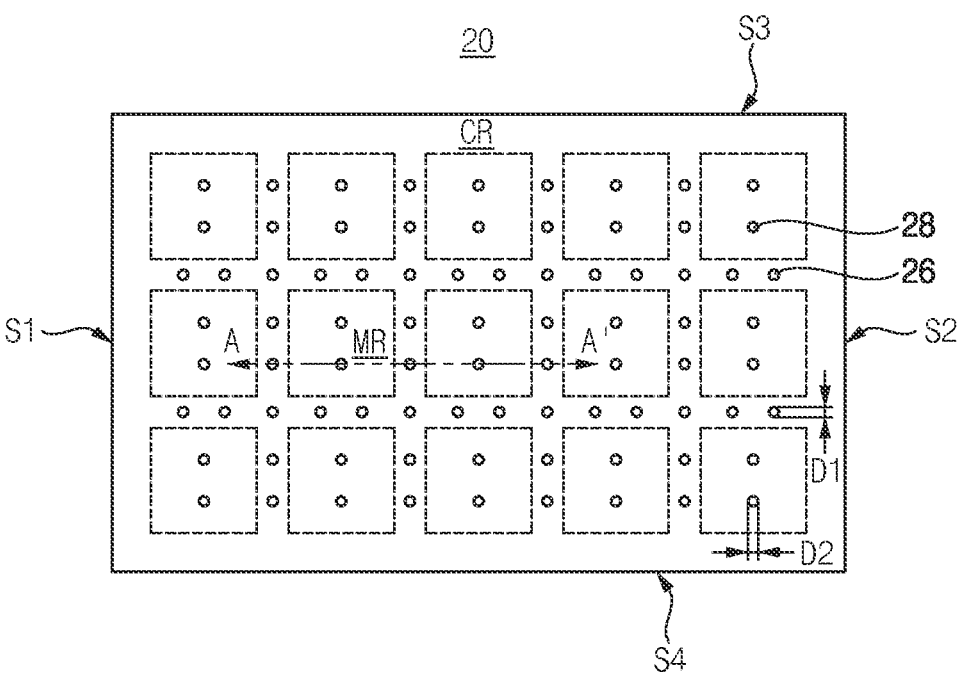

FIG. 5 is a flowchart illustrating a method of manufacturing an electronic device in accordance with example embodiments. FIGS. 6 to 13 are views illustrating a method of manufacturing an electronic device in accordance with example embodiments. In particular, FIG. 6 is a plan view illustrating a strip substrate on which semiconductor chips are mounted. FIGS. 8, 10, 11 and 12 are cross-sectional views taken along the line A-A' in FIG. 6.

Referring to FIGS. 5 to 10, first, a substrate 20 including a plurality of substrate pads 22 may be provided and a plurality of vapor passage holes (e.g., the first vapor passage hole 26, the second vapor passage hole 28) may be formed in the substrate 20 (S100). A solder paste 24 may be coated on the substrate pads 22 of the substrate 20 (S110), and a solder 40 may be disposed on the solder paste 24 (S120).

In FIG. 6, the substrate 20 may be a multilayer circuit board as a package substrate having an upper surface and a lower surface opposite to each other. The substrate 20 may be a strip substrate for manufacturing a semiconductor strip such as a Printed Circuit Board (PCB).

The substrate 20 may have a first side portion S1 and a second side portion S2 extending in a direction parallel to a second direction parallel to the upper surface and facing each other, and a third side portion S3 and a fourth side portion S4 extending in a direction parallel to a first direction (X direction) perpendicular to the second direction and facing each other. When viewed from a plan viewpoint, the substrate 20 may have a quadrangular shape. The substrate 20 may have a predetermined area (e.g., 77.5 mm×240 mm).

The substrate 20 may include a mounting region MR on which a semiconductor chip is mounted and a cutting region CR surrounding the mounting region MR. A plurality of electronic components 30 (e.g., semiconductor chips) may be disposed on the mounting regions MR of the substrate 20 respectively. For example, tens to hundreds of electronic components 30 (e.g., semiconductor chips) may be arranged in a matrix form on the substrate 20.

Then, a plurality of the vapor passage holes (e.g., the first vapor passage hole 26 and the second vapor passage hole 28) may be formed (configured) to penetrate the substrate 20. The vapor passage holes may be formed by a drilling processing process, a laser processing process, or the like. The vapor passage holes may have a circular or polygonal shape.

In example embodiments, a plurality of the first vapor passage holes 26 may be formed in a first region of the substrate 20, and a plurality of the second vapor passage holes 28 may be formed in a second region of the substrate 20.

The first region may be located in the cutting region CR of the substrate 20 and the second region may be located in the mounting region MR of the substrate 20. In this case, the second vapor passage hole 28 formed in the mounting region MR may be used as a sealing material passage hole through which an underfill, which is a sealing member between an upper surface of the substrate 20 and the electronic component 30 (e.g., semiconductor chip), passes, when a Molded UnderFill (MUF) process is performed after the reflow process. Accordingly, during the molded underfill process, the sealing member may move at a uniform flow rate through the sealing material passage hole (the second vapor passage hole 28), thereby preventing generation of voids in the underfill.

For example, the first vapor passage hole 26 may have a diameter D1 of a first size, and the second vapor passage hole 28 may have a diameter D2 of a second size smaller than the first size. Alternatively, the diameter of the first size of the first vapor passage hole 26 may be equal to or greater than the diameter of the second vapor passage hole 28.

Figure 7:
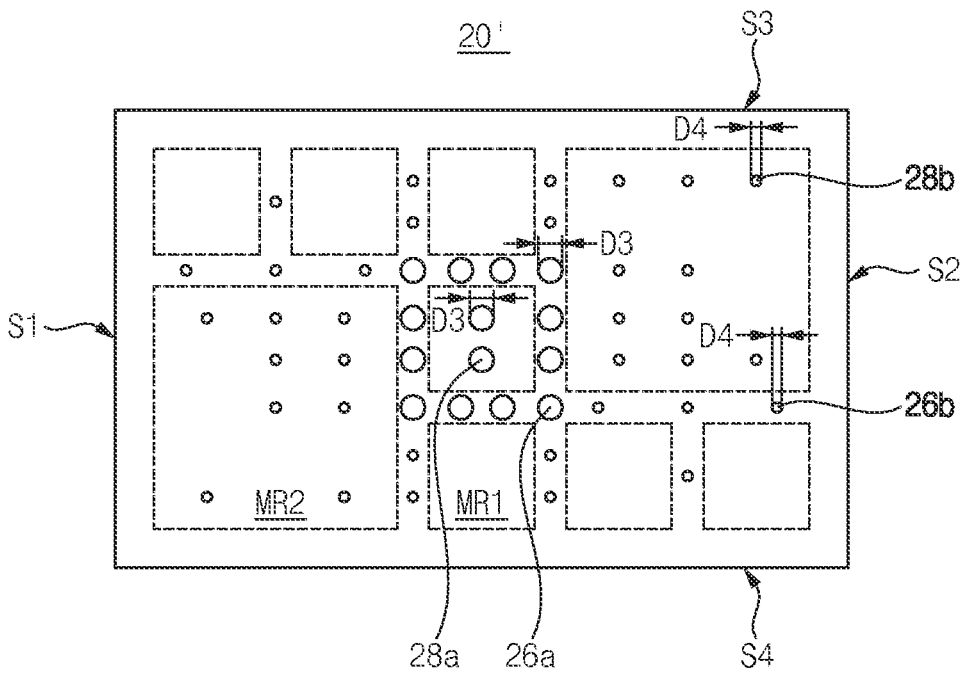

As illustrated in FIG. 7, in another example, a substrate 20' may include a first mounting region MR1 on which a first semiconductor device is mounted and a second mounting region MR2 on which a second semiconductor device is mounted. The first mounting area MR1 may have a first planar area, and the second mounting area MR2 may have a second planar area greater than the first planar area.

A first set of vapor passage holes (e.g., a third vapor passage hole 26a and a fourth vapor passage hole 26b) may be formed outside the first and second mounting regions MR1 and MR2, and a second set of vapor passage holes (e.g., a fifth vapor passage hole 28a and a sixth vapor passage hole 28b) may be formed in the first and second mounting regions MR1 and MR2.

Intervals between the first set of vapor passage holes (e.g., the third vapor passage hole 26a and the fourth vapor passage hole 26b) and the second set of vapor passage holes (the fifth vapor passage hole 28a and the sixth vapor passage hole 28b), sizes, positions thereof, etc. may be determined in consideration of the degree of heat transfer, the layout of bumps and wires, and the like.

For example, in a central region where heat transfer is relatively difficult, the third vapor passage holes 26a and the fifth vapor passage holes 28a may be formed relatively closer together, as illustrated in FIG. 7. In a peripheral region where heat transfer is relatively easy, the fourth vapor passage holes 26b and the sixth vapor passage holes 28b may be formed relatively further apart, as illustrated in FIG. 7.

Even within the second mounting region MR2, a relatively large number of sixth vapor passage holes 28b may be formed in a region relatively close to the central region, and a relatively small number of sixth vapor passage holes 28b may be formed in a region relatively close to the peripheral region. Relatively few can be formed.

For example, the third vapor passage hole 26a and the fourth vapor passage hole 28a formed in the central region may have a diameter D3 of a third size, and the fourth vapor passage hole 26b and the sixth vapor passage hole 28b formed in the peripheral region may have a diameter D4 of a fourth size smaller than the third size.

For example, the vapor passage holes may not be formed in the first mounting region MR1 having a relatively small planar area. For example, the vapor passage holes may be formed only in the cutting region CR around the first mounting region MR1.

Figure 8:
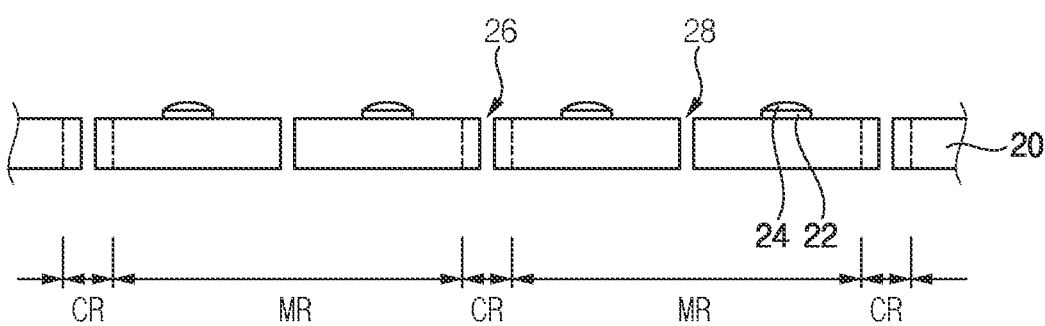

In FIG. 8, the solder paste 24 may be coated on each of the plurality of substrate pads 22 of the substrate 20. For example, a pitch between the substrate pads 22 of the substrate 20 may be within a range of several tens of microns.

The solder paste 24 may be printed onto the substrate pads 22 of substrate 20. For example, the solder paste 24 may be printed by a stencil printer. A stencil may be a metal foil having a plurality of openings corresponding to an array of solders that are subsequently placed. During printing, the solder paste 24 may be printed to fill the openings of the stencil. The solder paste 24 may include solder power and flux. The flux may include resin, solvent, activator, antioxidant, etc.

Alternatively, the solder paste 24 may be coated to a surface of the solder 40 formed on the electronic component 30 (e.g., semiconductor chip).

Figure 9:
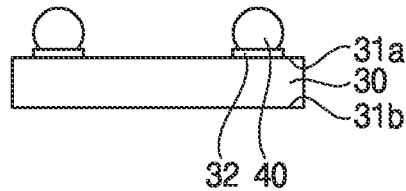

In FIG. 9, the solder 40 may be formed on the electronic component 30 mounted on the substrate 20. The electronic component 30 may be a semiconductor chip. Alternatively, the electronic component may be a semiconductor package. In this case, the substrate 20 may be a module board.

A plurality of input/output pads 32 may be formed on a first surface 31a of the electronic component 30. The solders 40 may be respectively formed on the input/output pads 32.

After forming an Under Bump Metal (UBM) on the input/output pad 32, the solder 40 may be formed on the under bump metal.

Figure 10:
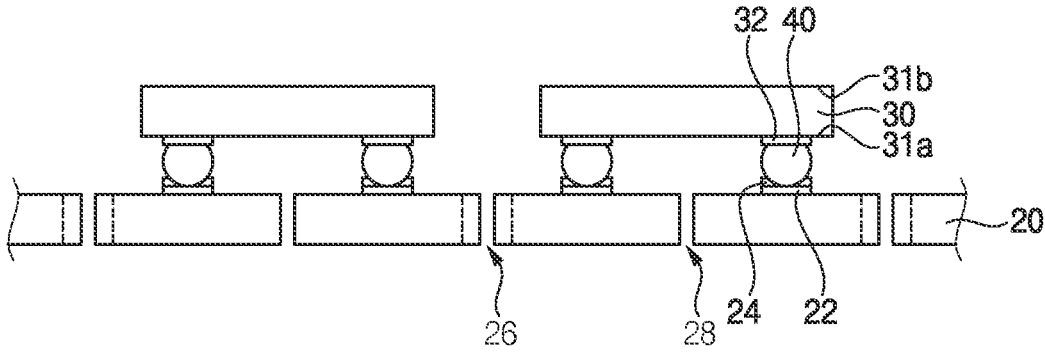

In FIG. 10, the electronic component 30 may be disposed on the substrate 20. Thus, the solder 40 is interposed between the input/output pad 32 of the electronic component 30 and the solder paste 24. The semiconductor chips may be mounted on the substrate 20 by a flip chip bonding method. Then, the vapor phase reflow soldering may be performed (operation S120 in FIG. 5).

Figure 11:
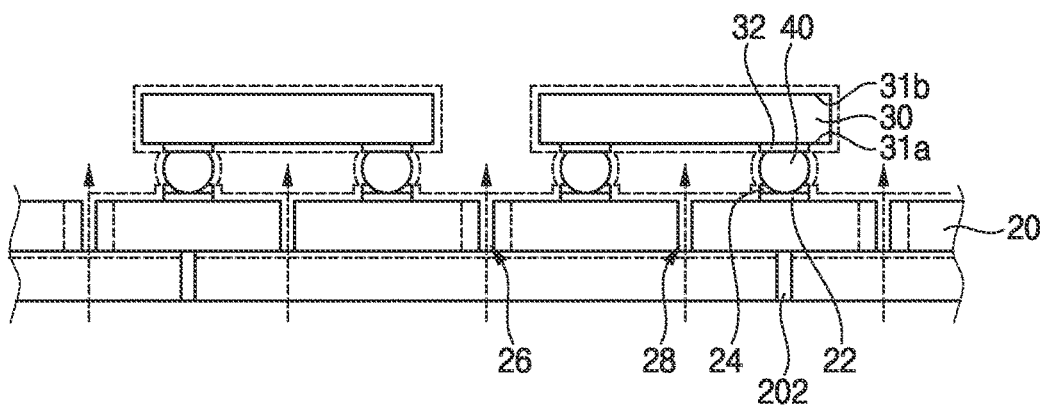

In FIG. 11, the substrate 20 on which the electronic component 30 is mounted may be loaded into the vapor generating chamber 100 of the solder reflow apparatus 10 of FIG. 1. While the substrate 20 is sequentially moved in the vertical direction within the vapor generating chamber 100, the heat transfer fluid in a vapor state may be in contact with the surface of the substrate 20 to heat the solder paste 24, thereby reflowing the solder 40 and thus, a bump of the solder 40 may be formed between the substrate pad 22 and the input/output pad 32.

In example embodiments, after the substrate 20 is loaded, the Galden solution F may be heated by the heater 110 and start to boil. The saturated vapor from the Galden solution may be distributed within the space 101 of the vapor generating chamber 100. At this time, the vapor may have a density gradient according to height, and thus, a temperature gradient along a vertical direction may be formed in the vapor generating chamber 100.

After the article S is preheated at the third height 3, the article may be moved to the second height H2 and activated (soaked). The substrate 20 may be preheated to prevent various soldering defects and to provide a more solid and conductive joint. There may be a secondary vapor phase which is produced at a cooler temperature than the main vapor layer at the third and second heights H3 and H2. No soldering takes place in this zone, only a temperature rises.

The article S may be moved to the first height H1 so that the solder 40 may be reflowed. When the article S is immersed in the vapor at the first height H1, the vapor may serves as a heat transfer medium. Since the temperature of the vapor and the temperature of the substrate 20 at the first height H1 are different from each other, vapor may be condensed on a surface of the article S to form a layer. The vapor condensing on the surface may transfer latent heat to the surface of the substrate 20 during condensation to reflow a solder paste.

At this time, the vapor under the substrate stage 200 may move through the openings 201 of the substrate stage 200 and the vapor passage holes (e.g., a first vapor passage hole 26, a second vapor passage hole 28) of the substrate 20 to be supplied to the solder 40 and the surroundings of the solder 40. Accordingly, the vapor may be sufficiently supplied to regions adjacent to the vapor passage holes (e.g., the first vapor passage hole 26) of the substrate 20 to achieve uniform heat transfer over the entire area of the article S.

Then, after the solder 40 is soldered, the article S may move to the top of the chamber and then may be cooled. Accordingly, the solder joints may be cooled down and solidified.

Figure 12:
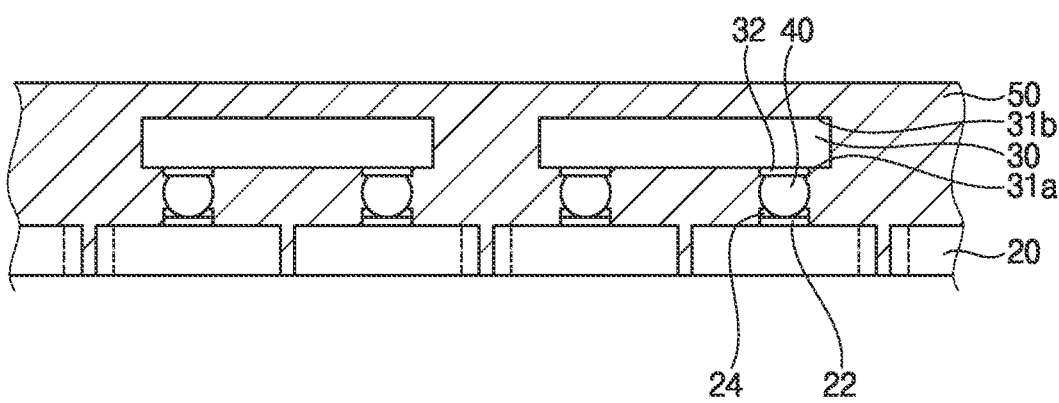

In FIG. 12, a molding member 50 may be formed on the substrate 20 to cover the electronic components 30 (e.g., semiconductor chips) (S140).

In example embodiments, the molding member 50 may be formed on the substrate 20 by a transfer molding apparatus. The substrate 20 may be disposed in a molding space of a mold of the molding apparatus, and a sealing material may flow at high temperature and under high pressure when a lower mold and an upper mold are clamped, so that the liquid sealing material flows inside the molding space and is solidified to form the molding member covering the electronic components 30 (e.g., semiconductor chips). For example, the sealing material may include an Epoxy Mold Compound (EMC).

Figure 13:
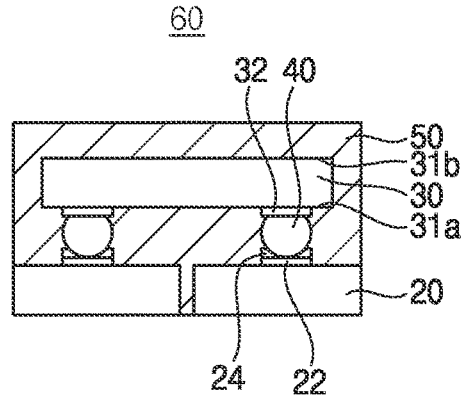

In FIG. 13, the substrate 20 may be sawed by a sawing process to complete semiconductor packages 60. In example embodiments, external connection members such as solder balls may be formed on outer connection pads on a lower surface of the substrate 20, and the cutting region CR of the substrate 20 may be removed by a cutting device such as a blade. Accordingly, the semiconductor packages P may be individualized from the substrate 20.

Figure 14:
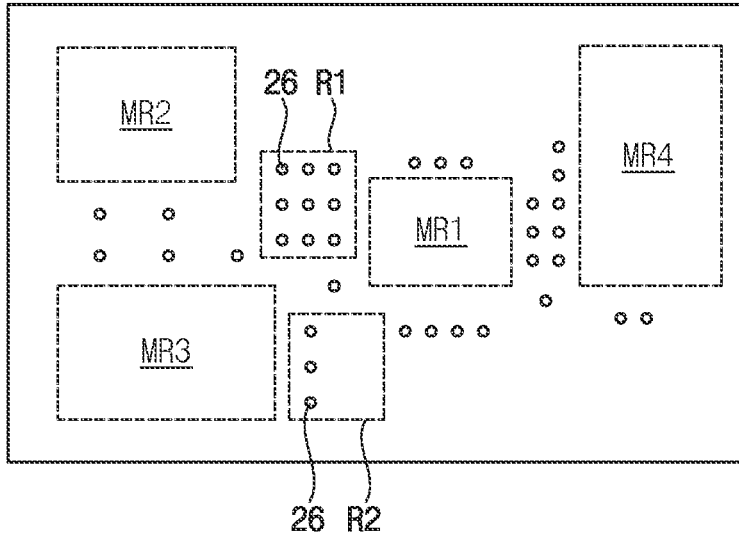

FIG. 14 is a plan view illustrating a strip substrate on which semiconductor chips are mounted in accordance with example embodiments. In FIG. 14, different types of semiconductor devices may be mounted on mounting regions MR1, MR2, MR3 and MR4 of a substrate 20. For example, the semiconductor devices may include a logic semiconductor device and a memory device. The logic semiconductor device may be an Application-Specific Integrated Circuit (ASIC) serving as a host such as a Central Processing Unit (CPU), Graphics Processing Unit (GPU), or System-on-Chip (SoC). The memory device may include a High Bandwidth Memory (HBM) device.

In example embodiments, the vapor passage holes (e.g., the first vapor passage hole 26) may be formed in consideration of heat transfer differences according to wiring layouts. For example, a relatively large number of vapor passage holes may be formed in a region where bumps are dense, and a relatively small number of vapor passage holes may be formed in a region where bumps are relatively rare.

For example, the first vapor passage holes 26 may be formed in a central region R1 of the substrate 20 where heat transfer is relatively difficult, and second vapor passage holes 28 may be formed in a peripheral region R2 of the substrate 20. In this case, the number of the first vapor passage holes 26 within the same area may be greater than the number of the second vapor passage holes 28 within the same area.

In addition, a relatively large number of vapor passage holes may be formed in a region where copper wires are relatively dense in the substrate 20, and a relatively small number of vapor passage holes may be formed in a region where the copper wires are relatively sparse.

Through the above processes, a semiconductor package including a logic device or a memory device and a semiconductor module including the same may be manufactured. The semiconductor package may include logic devices such as (CPUs), Main Processing Units (MPUs), or Application Processors (APs), or the like, and volatile memory devices such as Dynamic Random Access Memory (DRAM) devices, HBM devices, or non-volatile memory devices such as flash memory devices, Parallel RAM (PRAM) devices, Magnetoresistive RAM (MRAM) devices, Resistive (ReRAM) devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present disclosure. Accordingly, all such modifications are intended to be included within the scope of example embodiments as defined in the claims.

What is claimed is:

1. A method of manufacturing an electronic device, the method comprising:

providing a substrate having a plurality of mounting regions on which electronic components are mounted respectively;

forming a plurality of vapor passage holes that penetrate the substrate entirely from a bottom surface of the substrate to a top surface of the substrate;

disposing the electronic components on the substrate via bumps;

heating a first heat transfer fluid to generate a second heat transfer fluid in a vapor state;

supplying at least a portion of the second heat transfer fluid in the vapor state through at least one of the plurality of vapor passage holes of the substrate; and soldering the bumps using the at least the portion of the second heat transfer fluid in the vapor state, wherein the plurality of vapor passage holes are formed in a cutting region that is disposed around the plurality of mounting regions.

2. The method of claim 1, wherein the forming the plurality of vapor passage holes comprises:

forming a first set of the plurality of vapor passage holes in a first region of the substrate; and forming a second set of the plurality of vapor passage holes in a second region of the substrate.

3. The method of claim 2, wherein the first set of the plurality of vapor passage holes has a diameter of a first size, and the second set of the plurality of vapor passage holes has a diameter of a second size smaller than the first size.

4. The method of claim 1, wherein the soldering the bumps using the at least the portion of the second heat transfer fluid in the vapor state comprises:

loading the substrate on which the electronic components are disposed into a vapor generating chamber that accommodates the first heat transfer fluid.

5. The method of claim 1, wherein the disposing the electronic components on the substrate via the bumps comprises:

printing a solder paste on substrate pads of the substrate;

forming solders on input/output pads of the electronic components; and disposing the electronic components on the substrate such that the solders are interposed between the input/output pads and the solder paste.

6. The method of claim 1, further comprising:

after soldering the bumps, forming a molding member on the substrate to cover the electronic components.

7. The method of claim 6, further comprising cutting the substrate along the cutting region that is disposed around the plurality of mounting regions.

8. A method of manufacturing an electronic device, the method comprising:

forming a plurality of vapor passage holes that penetrate a substrate entirely from a bottom surface of the substrate to a top surface of the substrate, the substrate having a plurality of mounting regions on which electronic components are mounted respectively;

disposing the electronic components on the substrate via bumps;

loading the substrate on which the electronic components are disposed into a vapor generating chamber that accommodates a first heat transfer fluid;

heating the first heat transfer fluid to generate a second heat transfer fluid in a vapor state within the vapor generating chamber;

supplying the second heat transfer fluid in the vapor state through at least one of the plurality of vapor passage holes; and soldering the bumps using the second heat transfer fluid in the vapor state, wherein the plurality of vapor passage holes are formed in a cutting region that is disposed around the plurality of mounting regions.

9. The method of claim 8, wherein the forming the plurality of vapor passage holes comprises:

forming a first set of the plurality of vapor passage holes in a first region of the substrate; and forming a second set of the plurality of vapor passage holes in a second region of the substrate.

10. The method of claim 9, wherein the first set of the plurality of vapor passage holes has a diameter of a first size, and the second set of the plurality of vapor passage holes has a diameter of a second size smaller than the first size.

11. The method of claim 8, wherein the disposing the electronic components on the substrate via the bumps comprises:

printing a solder paste on substrate pads of the substrate;

forming solders on input/output pads of the electronic components; and disposing the electronic components on the substrate such that the solders are interposed between the input/output pads and the solder paste.

12. The method of claim 11, further comprising cutting the substrate along the cutting region that is disposed around the plurality of mounting regions.

13. The method of claim 8, wherein the first heat transfer fluid comprises a Galden solution.

14. A method of manufacturing an electronic device, the method comprising:

forming a plurality of vapor passage holes that penetrate a substrate entirely from a bottom surface of the substrate to a top surface of the substrate, the substrate having a plurality of mounting regions on which electronic components are mounted respectively;

printing a solder paste on substrate pads of the substrate;

forming solders on input/output pads of the electronic components and disposing the electronic components on the substrate such that the solders are interposed between the input/output pads and the solder paste;

loading the substrate on which the electronic components are disposed into a vapor generating chamber that accommodates a first heat transfer fluid;

heating the first heat transfer fluid to generate a second heat transfer fluid in a vapor state within the vapor generating chamber;

supplying the second heat transfer fluid in the vapor state through at least one of the plurality of vapor passage holes;

soldering the solders using the second heat transfer fluid in the vapor state, wherein the plurality of vapor passage holes are formed in a cutting region that is disposed around the plurality of mounting regions.

* * * * *